(12) United States Patent
Kreifeldt et al.

(10) Patent No.: US 11,084,327 B2
(45) Date of Patent: *Aug. 10, 2021

(54) APPARATUS FOR PROVIDING ENVIRONMENTAL NOISE COMPENSATION FOR A SYNTHESIZED VEHICLE SOUND

(71) Applicant: Harman International Industries, Incorporated, Stamford, CT (US)

(72) Inventors: Richard Kreifeldt, South Jordan, UT (US); James Kirsch, Salt Lake City, UT (US)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/564,746

(22) Filed: Sep. 9, 2019

(65) Prior Publication Data

US 2019/0389376 A1    Dec. 26, 2019

Related U.S. Application Data

(63) Continuation of application No. 14/083,846, filed on Nov. 19, 2013, now Pat. No. 10,414,337.

(51) Int. Cl.
*B60Q 5/00* (2006.01)
*H03G 3/32* (2006.01)
(Continued)

(52) U.S. Cl.
CPC .............. *B60C 5/008* (2013.01); *G10K 15/02* (2013.01); *H03G 3/32* (2013.01); *H04R 2499/13* (2013.01)

(58) Field of Classification Search
CPC .......... B60Q 5/008; G10K 15/02; H03G 3/32; H04R 2499/13
See application file for complete search history.

(56) References Cited

U.S. PATENT DOCUMENTS 4,476,571 A    10/1984  Tokumo et al.
5,635,903 A *   6/1997  Koike .................... A63H 17/34
                                                    340/384.1

(Continued)

FOREIGN PATENT DOCUMENTS

CN    102714033 A    10/2012
CN    103108777 A     5/2013
(Continued)

OTHER PUBLICATIONS

Extended European Search Report for corresponding Application No. 14191812.8, dated Oct. 7, 2015, 8 pgs.

*Primary Examiner* — Fan S Tsang
*Assistant Examiner* — Daniel R Sellers
(74) *Attorney, Agent, or Firm* — Brooks Kushman P.C.

(57) ABSTRACT

In at least one embodiment, an apparatus for generating a simulated vehicle sound is provided. At least one parameter module receives a first driver throttle signal and to transmit a first input signal indicative of a first simulated vehicle sound. An engine sound generator block audibly generates a first simulated vehicle sound in response to the first input signal. An engine sound removal block is operably coupled to a microphone that receives a first microphone input signal. The first microphone input signal includes first environmental noise associated with a vehicle exterior environment and the first simulated vehicle sound. The engine sound removal block is configured to filter the first simulated vehicle sound from the first microphone input signal to determine the first environmental noise. The engine sound generator generates a second simulated vehicle sound that is louder than the first environmental noise.

20 Claims, 5 Drawing Sheets

(51) Int. Cl.
  *G10K 15/02* (2006.01)
  *B60C 5/00* (2006.01)

(56) References Cited

U.S. PATENT DOCUMENTS

| | | | |
|---|---|---|---|
| 6,529,605 B1 | 3/2003 | Christoph |
| 7,302,062 B2 | 11/2007 | Christoph |
| 7,333,618 B2 | 2/2008 | Shuttleworth et al. |
| 7,881,482 B2 | 2/2011 | Christoph |
| 8,005,231 B2 | 8/2011 | Shuttleworth et al. |
| 8,116,481 B2 | 2/2012 | Christoph |
| 8,170,221 B2 | 5/2012 | Christoph |
| 8,184,828 B2 | 5/2012 | Christoph |
| 2003/0112088 A1 | 6/2003 | Bizjak |
| 2005/0063552 A1 | 3/2005 | Shuttleworth et al. |
| 2005/0113168 A1 | 5/2005 | Maeda |
| 2005/0213776 A1 | 9/2005 | Honji et al. |
| 2006/0074645 A1 | 4/2006 | Tischer |
| 2010/0228482 A1 | 9/2010 | Yonak |
| 2011/0093149 A1 | 4/2011 | Tanaka |
| 2011/0199199 A1 | 8/2011 | Perkins |
| 2012/0062391 A1 | 3/2012 | Pan |
| 2012/0106748 A1 | 5/2012 | Peachey et al. |
| 2012/0166042 A1 | 6/2012 | Kokido et al. |
| 2013/0009768 A1 | 1/2013 | Terao |
| 2013/0177167 A1 | 7/2013 | Takahashi et al. |

FOREIGN PATENT DOCUMENTS

| | | |
|---|---|---|
| CN | 103260951 A | 8/2013 |
| JP | H08279090 A | 10/1996 |
| JP | H11288291 A | 10/1999 |
| JP | 2000010576 A | 1/2000 |
| JP | 200940317 A | 2/2009 |
| WO | 2012011163 A1 | 1/2012 |

\* cited by examiner

APPARATUS FOR PROVIDING ENVIRONMENTAL NOISE COMPENSATION FOR A SYNTHESIZED VEHICLE SOUND

This application is a continuation of U.S. application Ser. No. 14/083,846 filed Nov. 19, 2013, now U.S. Pat. No. 10,414,337, issued Sep. 17, 2019, the disclosure of which is hereby incorporated in its entirety by reference herein.

TECHNICAL FIELD

Aspects disclosed herein generally relate to an apparatus for providing environmental noise compensation for a synthesized vehicle sound.

BACKGROUND

A system for simulated multi-gear vehicle sound generation is disclosed in U.S. Publication No. 2012/0106748 ("the '748 publication"). The '748 publication discloses that the vehicle sound generator system is configured to generate a signal for driving one or more speakers to produce sound waves simulating sounds associated with a desired engine type. The signal is based on one or more operating conditions of a vehicle. The vehicle sound generator system is configured to select sounds from a plurality of sounds based on the operating conditions of the vehicle. Each sound corresponds to a simulated sound of an engine operating in a respective gear. The vehicle sound generator system may generate the signal to drive the speakers to produce selected sounds to simulate shifting between the respective gears.

SUMMARY

In one embodiment, an apparatus for generating a simulated vehicle sound is provided. The apparatus includes at least one parameter module, an engine sound generator block, and an engine sound removal block. The at least one parameter module is configured to receive a first driver throttle signal indicative of a first position of a throttle for the vehicle and to transmit a first input signal indicative of a first simulated vehicle sound in response to at least the first driver throttle signal. The engine sound generator block is configured to audibly generate a first simulated vehicle sound in response to the first input signal. The engine sound removal block is operably coupled to a microphone that receives a first microphone input signal. The first microphone input signal includes a first environmental noise associated with an environment exterior to the vehicle and the first simulated vehicle sound. The engine sound removal block is configured to filter the first simulated vehicle sound from the first microphone input signal to determine the first environmental noise. The engine sound removal block is further configured to generate a first output signal indicative of the first environmental noise. The engine sound generator block is further configured to generate a second simulated vehicle sound in response to at least the first output signal such that the second simulated vehicle sound is louder than the first environmental noise.

In another embodiment, an apparatus for generating a simulated vehicle sound is provided. The apparatus includes at least one parameter module, an engine sound generator block, and an engine sound removal block. The at least one parameter module is configured to receive a first vehicle speed signal indicative of a first speed of the vehicle and to transmit a first input signal indicative of a first simulated vehicle sound in response to at least the first vehicle speed signal. The engine sound generator block is configured to audibly generate a first simulated vehicle sound in response to the first input signal. The engine sound removal block is operably coupled to a microphone that receives a first microphone input signal. The first microphone input signal includes a first environmental noise associated with an environment exterior to the vehicle and the first simulated vehicle sound. The engine sound removal block is configured to filter the first simulated vehicle sound from the first microphone input signal to determine the first environmental noise and to generate a first output signal indicative of the first environmental noise. The engine sound generator block is further configured to generate a second simulated vehicle sound in response to at least the first output signal such that the second simulated vehicle sound is louder than the first environmental noise.

In another embodiment, an apparatus for generating a simulated vehicle sound is provided. The apparatus includes a first parameters module, a second parameters module, an engine sound generator block and an engine sound removal block. The first parameters module is configured to generate tonal information related to a first vehicle operating characteristic. The second parameters module is configured to generate noise information related to the first vehicle operating characteristic. The engine sound generator block is configured to audibly generate a first simulated vehicle sound in response to the tonal information and the noise information. The engine sound removal block is operably coupled to a microphone that receives a first microphone input signal. The first microphone input signal includes an environmental noise as associated with the environment exterior to the vehicle and the first simulated vehicle sound. The engine sound removal block is configured to remove the first simulated vehicle sound from the first microphone input signal to determine the environmental noise. The engine sound removal block is further configured to generate a first output signal indicative of the environmental noise. The engine sound generator block is further configured to generate a second simulated vehicle sound in response to at least the first output signal such that the second simulated vehicle sound is louder than the environmental noise.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

DETAILED DESCRIPTION

Figure 1:
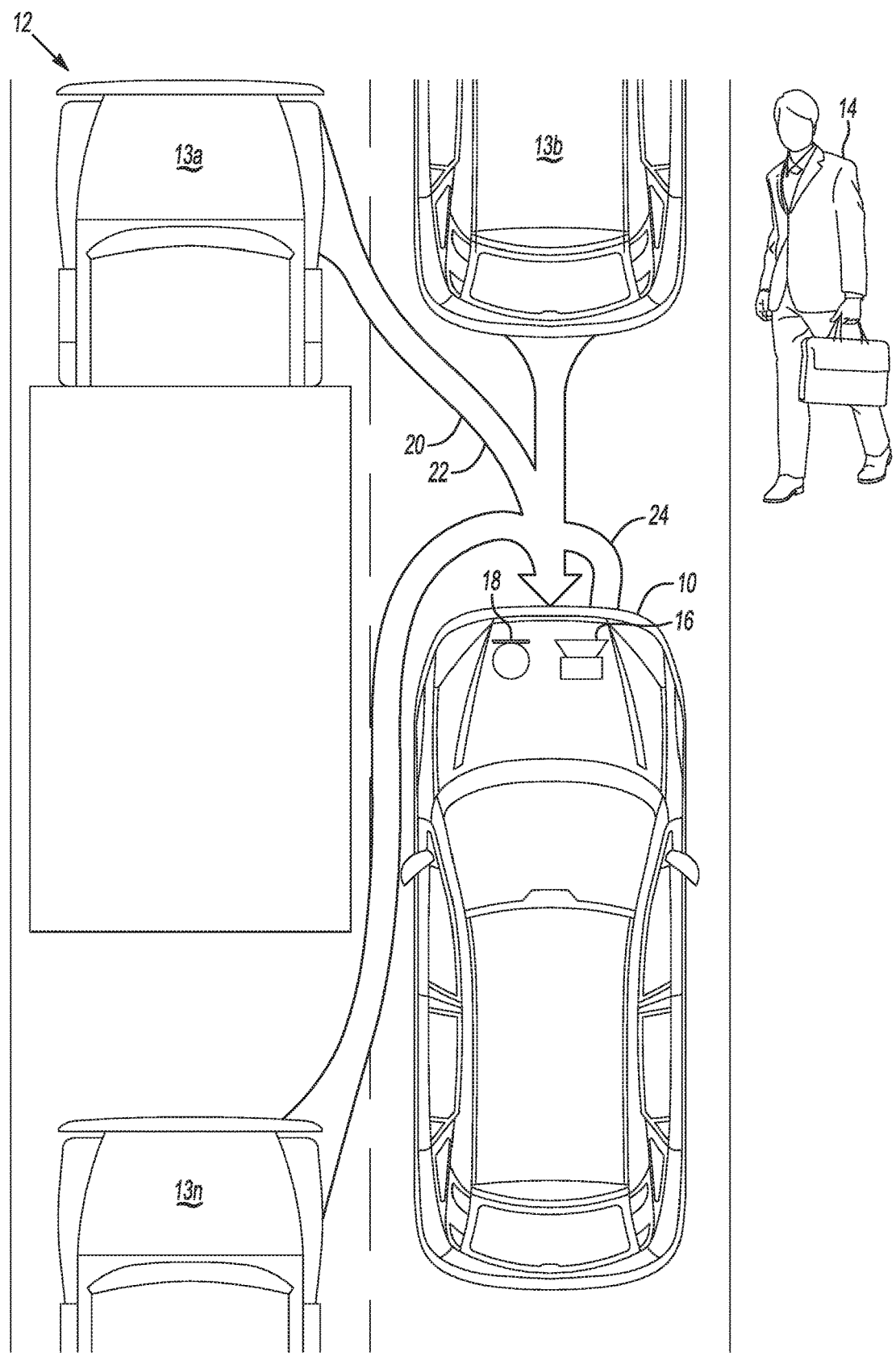
FIG. 1 depicts a host vehicle in a traffic condition with one or more pedestrians positioned nearby.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The embodiments of the present disclosure generally provide for a plurality of circuits or other electrical devices. All references to the circuits and other electrical devices, and the functionality provided by each, are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and software which co-act with one another to perform operation(s) disclosed herein. In addition, any one or more of the electric devices may be configured to execute a computer-program that is embodied in a non-transitory computer readable medium that is programmed to perform any number of the functions as disclosed.

Increasing fuel costs and environmental concerns associated with fuel consumption have bolstered electric vehicle and hybrid vehicle usage. However, as generally known, engines that utilize combustible fuel, generate noise associated with acceleration and shifting gears. Such an engine sound generally alerts nearby pedestrians of the presence of the vehicle which in turn enables pedestrians to avoid the vehicle. Electric and hybrid vehicles generate or synthesize engine sound for the purpose of alerting pedestrians of the presence of these vehicles. One proposal to generate synthesized engine sound is to have the vehicle generate such engine sound at a constant 65 dB SPL. However, when the vehicle is located in a heavy traffic condition, where environmental noise is high, generation of such a synthesized engine sound at this level may not be loud enough for the pedestrian. Conversely, when the vehicle is located in a rural setting, where environmental noise is low, the generation of the synthesized engine sound at this level may be too loud and may be a nuisance for pedestrians.

One attempt that may mitigate the issue of a constant synthesized engine sound (i.e., a consistent loud engine sound for heavy traffic conditions and low traffic conditions) irrespective of environmental noise is set forth in FIG. 1. For example, FIG. 1 depicts a host vehicle 10 in a traffic condition 12 (e.g., a number of surrounding vehicles 13a-13n ("13")) with one or more pedestrians 14 positioned nearby. The host vehicle 10 includes a speaker 16 for transmitting synthesized engine sound (or simulated engine sound). The host vehicle 10 further includes a microphone 18 for receiving environmental noise 20 from the environment outside of the host vehicle 10. In general, it is desirable for the host vehicle 10 to synthesize or generate engine sound at a level that is perceptually louder than the environmental noise 20 to ensure that the pedestrian 14 near the host vehicle 10 is alerted of the presence of the same.

However, one issue related to engine synthesis from the host vehicle 10 is the presence of sound bleed. This condition involves the microphone 18 picking up the synthesized engine sound as generated by the speaker 16 in addition to the environmental noise 20 from the surrounding environment. In this case, the microphone 18 receives a microphone input signal 22 that includes the environmental noise 20 and the previously generated synthesized engine sound. The host vehicle 10 then increases the volume of the synthesized engine sound to a level that is perceptually louder than the environmental noise 20 and a previously generated synthesized engine sound 24. This condition results in a runaway gain or gain chase, where the loudness of the synthesized engine sound will continue to increase thereby causing the synthesized engine sound to be too loud for the pedestrian 14.

In view of the sound bleed as noted above, it is desirable to remove the previously generated synthesized engine sound 24 from the environment around the vehicle in order to determine the true level of the environmental noise 20. Accordingly, in order to cancel the synthesized engine sound, the true synthesized engine sound needs to be accurately known. Removing too little of the synthesized engine sound may result in slower runaway gain which is still not desirable. Removing too much of the synthesized engine sound may reduce the effect of the environmental noise compensation, so that louder traffic conditions may not be compensated for. It is recognized herein that more accurate knowledge of the synthesized engine sound results in a more accurate removal of the synthesized engine sound from the noise picked up at the microphone 18 thereby enabling the vehicle 10, to produce the synthesized engine sound level that not only provides adequate notice of the presence of the vehicle 10 but is also tolerable to the pedestrian 14.

Figure 2:
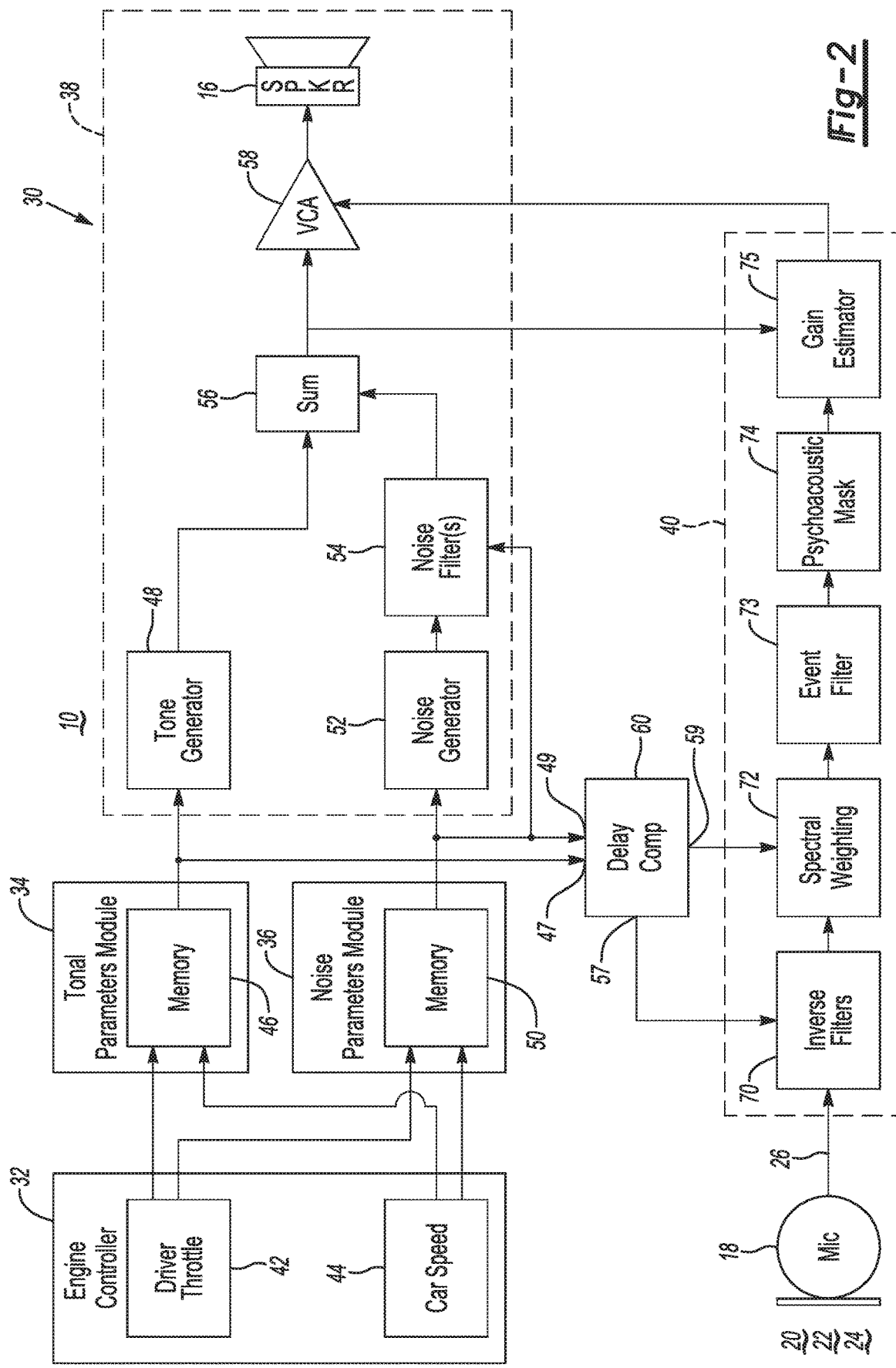
FIG. 2 depicts an apparatus for compensating for traffic noise and for synthesizing engine sound in accordance to one embodiment.

FIG. 2 depicts an apparatus 30 for compensating for traffic noise and for synthesizing a vehicle sound in accordance to one embodiment. The apparatus 30 is generally positioned in the vehicle 10 and includes the speaker 16 and the microphone 18. It is recognized that the vehicle 10 may include any number of speakers 16 and microphones 18. The apparatus 30 generally includes an engine controller 32, a tonal parameters module 34, a noise parameters module 36, a synthesized engine sound generator block 38, and a synthesized engine sound removal block 40. It is recognized that the apparatus 30 may generate a synthesized vehicle sound including, but not limited to, a synthesized engine sound for an internal combustion engine (ICE) as used in connection with any of the following vehicle types: an electric vehicle, hybrid/electric vehicle, jet, motorboat, train, etc.

The engine controller 32 is generally configured to provide a signal indicative of various vehicle operating characteristics such as a desired throttle position (driver throttle) 42 in addition to vehicle speed 44 of the vehicle 10. For example, the engine controller 32 monitors a position of an accelerator pedal to determine the desired position of the throttle 42. The engine controller 32 transmits a signal indicative of the desired throttle position 42 of the vehicle 10 to the tonal parameters module 34 and to the noise parameters module 36. The engine sound generator block 38 uses such data to generate the synthesized engine sound. For example, audible pitches of a vehicle's internal combustion engine (ICE) are primarily dependent on the revolutions per minute (RPM) of the ICE. Thus, the synthesized engine sound may largely take into account simulated engine RPM. A correlation can be made between the desired throttle position 42 and the engine RPM. In general, since the vehicle 10 is an electric vehicle in some cases, it is necessary to simulate and provide some ICE value indicative of engine RPM for the ICE even though the ICE and engine RPM is not present in the electric vehicle for generating the synthesized engine sound.

The engine controller 32 is also generally configured to provide a signal indicative of vehicle speed 44 (e.g., the speed at which the vehicle is currently being driven at) to the tonal parameters module 34 and to the noise parameters module 36. The engine sound generator block 38 also uses such data to generate the synthesized engine sound. It is recognized that the RPM of the ICE has a relationship to the speed of the vehicle 10. As such, for the vehicle 10 that is implemented as an electric vehicle, a correlation can be made between the synthesized engine sound and vehicle speed, simulated engine RPM and other factors.

The tonal parameters module 34 includes memory 46 for correlating a tone based on the desired throttle position 42 (i.e., the simulated engine RPM), the vehicle speed 44, and or other factors. For example, a look up table (LUT) or other suitable mechanism may include a listing of various tones which comprise fundamental frequencies and harmonics that are associated with the corresponding simulated engine RPM (or engine speed), vehicle speed 44, tones associated with asymmetric mechanisms in the ICE, and additional motors (or pumps) in the vehicle 10.

In general, a tone may include an amplitude that ranges from 1 least significant bit (e.g. 96 dB down from full-scale) to full-scale (e.g., all bits in the digital word are 1). A tone may include a phase that ranges from −180 to +180 degrees, where 0 degrees is indicative of no phase shift being present. A phase difference of 180 degrees between two signals indicates a polarity change.

A tone may have a frequency range of about 15 Hz (e.g., the lower limit of human hearing) to about 16 kHz (e.g., the upper limit of human hearing). This range may be extended down to 0 Hz (DC) and up to half the sample rate (i.e., the Nyquist frequency), but tones in these extreme ranges may not be audible to humans. This frequency may also be relative to an engine fundamental frequency, where an integer multiple of the fundamental is a harmonic, and a non-integer multiple is a non-harmonic overtone. Tones can coexist in a plurality.

In general, engine tones of an ICE depend on the engine RPM. However, and as noted above, RPM depends on the throttle position (e.g., more throttle delivers more fuel which accelerates the engine) and also depends on the vehicle speed since, for example, a slower vehicle requires more load on the engine. This condition will slow the engine down given a constant throttle. Also, when there is a gear shift in the transmission (manual or automatic), the RPM will change significantly given a constant throttle position and constant car speed. The fundamental frequency of the tones as provided by the tonal parameters module 34 can be determined by the following equation:

$$\text{(Engine RPM}/((0.5)*\text{(number of strokes of the engine)})*\text{number of engine cylinders}/60 \quad \text{(Eq.1)}$$

In general, a vast number of vehicles utilize a 4-stroke engine. For example, for a 4-stroke, 4-cylinder engine, the fundamental frequency for engine speed of 3000 RPM yields a fundamental frequency of 100 Hz. Harmonics will also be present due to asymmetry in the driving mechanism and the bearings. For example, various devices (e.g., pistons in the engine, ball bearings, etc.) that are asymmetric in shape may generate fundamental frequencies and harmonics and hence tones. Such tonal information may be stored in the memory 46 for various asymmetric devices generally associated with the ICE in addition to the simulated engine RPM and/or vehicle speed 44.

In another implementation, the synthesized engine sound may be generated based on only vehicle speed. For example, a vehicle traveling at high speeds generates higher pitches. Thus, vehicle speed can be used instead of simulated RPM. To the driver, it is generally more natural to hear sounds that depend on throttle position. However, the pedestrian 14 has no knowledge of the driver's throttle position, only the speed of the vehicle 10 that is approaching. In view of the foregoing, it is possible to have a first loudspeaker 16 inside a cabin of the vehicle 10 for the driver and a second loudspeaker 16 outside the vehicle 10 for the pedestrians 14.

As noted above, the synthesized engine sound may also include tones associated with noise generated from various pumps such as water, fuel, and air pumps (e.g., vehicle operating characteristics) which operate at speeds related to the engine RPM if they are belt-driven. Electronically driven pumps may operate at independent speeds that are unrelated to the engine RPM. In other cases, these pumps run at higher speeds with higher RPMs, but not in a linear, regular, or proportional manner. For example, a water pump may respond to temperature, which slowly responds to the engine speed, while a fuel pump may respond to fuel line pressure, which slowly responds to throttle position. Pumps may, therefore, generate fundamental frequencies based tones depending on their respective pump speeds. The harmonic tones are proportional to their fundamental frequencies and their broadband noise from the flow of fluids through them. Accordingly, the tones as generated or provided from the tonal parameters module 34 may also take into account the speeds at which the pumps operate in addition to the broadband noise from the flow of fluids through the pumps. The tonal information (or tonal input signal) as generated from the tonal parameters module 34 may take into account any combination of engine RPM, vehicle speed, and factors attributed to pump speed, the flow of fluids through the pump, and/or asymmetric shaped mechanisms generally used in connection with the ICE. A tone generator 48 receives tonal information from the tonal parameters module 34 to generate the tone for the synthesized engine sound.

The noise parameters module 36 includes memory 50 for correlating synthesized engine sound to various vehicle operating characteristics such as the desired throttle position 42 (i.e., the engine RPM), the vehicle speed 44 and/or other factors to generate noise parameters (or a noise input signal). For example, a LUT or other suitable mechanism may include a listing of various simulated engine sound which correspond to a particular engine RPM, vehicle speed 44 and other factors. Since an ICE is powered by combustion (e.g., controlled explosions), engine sounds include noisy portions in addition to tonal information that are attributed to steady rotation. Noise is not necessarily flat in the spectrum and the noise may include a center frequency and a bandwidth which is useful for generating synthesized engine sound.

A noise component may include an amplitude that ranges from 1 least significant bit to full-scale. The noise component generally includes a frequency center that ranges from 0 Hz (DC) to half the sample rate (e.g., Nyquist). The noise component may include a bandwidth that ranges from 0 (at which point it becomes tonal) to a full-band (e.g. white or pink noise). This bandwidth is usually induced by a basic low pass, high pass, or band pass filter. The noise component may also include a spectral shape that is induced by more sophisticated filters (e.g., notch, FFT). Noise components can coexist in a plurality. When many low bandwidth noise components are spectrally separated from each other, the noise is considered sparse. However, when few (or one) high bandwidth noise components are spectrally adjacent, the noise is considered dense.

It is recognized that the center frequency of the noise increases with engine speed or engine RPM (e.g., consider the case of a jet that takes off and the sound generated as a result of the jet taking off, the pitch generated as a result of the jet taking off increases over time). In addition, noise is also generated with tires of the vehicle 10 that press on a road. It may be desirable to accentuate the tire noise with synthesized noise that depends on the speed of the vehicle 10.

In general, the synthesized engine sound may be based on simulated engine RPM as derived from the throttle position, the vehicle speed 44 and other factors (or vehicle operating characteristics) such as tires of the vehicle 10 engaging the road. The engine sound generator block 38 includes a noise generator 52 for generating and controlling the noise (e.g., volume and spectral density) as indicated by the noise parameters module 36. The spectral density is effectively the number of spectral bins with a noise signal therein.

The engine sound generator block 38 further includes a noise filter block 54 for filtering the noise as generated by the noise generator 52 to produce filtered noise in the mid to high frequencies. The noise filter block 54 may include any number and types of filters such as band-pass filters, shelf (or tilt) filters, and/or notch filters, etc. A summer circuit 56 receives a tone signal from the tone generator 48 and a noise signal from the noise filter block 54 and adds such signals together. An amplifier 58 receives a summer signal corresponding to the sum of the tone information and the noise information and provides a synthesized engine signal to the speaker 16. The amplifier 58 adjusts the gain of the synthesized engine signal based on an input from engine sound removal block 40. This aspect will be discussed in more detail below.

A delay compensation circuit 60 includes a first channel 47 for receiving the tonal information from the tonal parameters module 34 which is indicative of the identified tone based on the desired throttle position 42 and the vehicle speed 44 (in addition to other tones that relate to the additional motors (or pumps)) in the vehicle 10. The delay compensation circuit 60 includes a second channel 49 for receiving the noise information from the noise parameters module 36 which is indicative of the identified engine sound based on the desired throttle position 42 and the vehicle speed 44. The first channel 47 and the second channel 49 drive separate outputs 57 and 59, respectively. The delay compensation circuit 60 provides a delay for filtering the tonal information and the noise information at a point in time when the tonal information and noise information are received back at the vehicle 10 as the previously generated synthesized engine sound 24 in the microphone input signal 22. Such a delay generally takes into account any latency due to analog to digital conversion (ADC), digital to analog conversion (DAC), a speaker group delay, and propagation time. For example, the delay for ADC may be 1 ms and the delay for DAC may be 600 μs.

The microphone 18 is configured to digitize the environmental noise 20 and the previously generated synthesized engine sound 24 to generate a microphone sense signal 26. An analog to digital converter (not shown) performs the digitization of the environmental noise 20 and the previously generated synthesized engine sound 24. For the digital conversion to take place, some predetermined amount of time is needed to measure and quantify the signal level of the incoming environmental noise 20 and previously generated synthesized engine sound 24. In addition, the digital to analog conversion also requires some predetermined amount of time to convert the digital value back to an analog value and into an actual output voltage (e.g., the output voltage provided from the engine sound removal block 40 to the amplifier 58). This condition may cause a time delay of, for example, less than 1 ms. However, the delay may still be significant. In addition, the speaker 16 exhibits a group delay due to the frequency components of the signal that passes through the speaker 16. In general, the delay attributed to the frequency components as they pass through the speaker 16 differ based on the particular frequency component. In particular, group delay in the speaker 16 causes a lagging phase shift on an output pressure of the speaker 16 relative to the input voltage provided to the speaker 16.

In general, with propagation time, sound propagates through air at about 343 m/sec (or 1125 ft./sec), which is much slower than electricity in a wire. For every 13.5 inches (e.g., a little more than a foot) between the speaker 16 and the microphone 18, the sound received at the microphone 18 will be delayed by 1 ms. In view of the foregoing, it can be seen that the corruption (or sound bleed) from the speaker 16 to the microphone 18 is older than the tonal parameters and noise parameters that were used to generate synthesized engine sound. The various types of delays attributed to the aspects disclosed above (e.g., ADC, DAC, speaker group delay, and propagation delay) are generally constant with time. Accordingly, the delay compensation circuit 60 may provide a static delay value that corresponds to an overall time the previously generated synthesized engine sound 24 within the microphone input signal 22 is received back at the microphone 18 and processed by the vehicle 10.

The delay compensation circuit 60 provides such a static delay value to the engine sound removal block 40. In turn, the engine sound removal block 40 applies the filtering on the previously generated synthesized engine sound upon expiration of the delay time as indicated by the static delay value. Thus, the engine sound removal block 40 delays performing the filtering based on the time indicated by the static delay value such that the filtering is performed to remove the tonal and noise information that was included in the previously generated synthesized engine sound 24 at a time in which such information is expected to be received back at the vehicle 10 with the microphone input signal 22 and processed by the vehicle 10. The delay compensation circuit 60 outputs the static delay value on a third channel 57 and a fourth channel 59 to the engine sound removal block 40. The engine sound removal block 40 is generally configured to remove the tonal and noise information in the previously generated synthesized engine sound that is present in the microphone sense signal 26.

The microphone 18 may be positioned on an exterior portion of the vehicle 10 and is arranged on the vehicle 10 so as to avoid picking up turbulence. As noted above, the microphone 18 is generally arranged to pick up or receive the microphone input signal 22 from an environment outside of the vehicle 10 which includes the environmental noise 20 and the previously generated synthesized engine sound 24 from the vehicle 10.

The engine sound removal block 40 includes an inverse filter block 70, a spectral weighting block 72, an event filter block 73, a psychoacoustic mask block 74, and a gain estimator block 75. In general, the inverse filter block 70 receives the static delay value from the third channel 57. The inverse filter block 70 may include any number of filters for removing aspects of the tonal information such as synthesized narrowband components that may be included in the previously generated synthesized engine sound. In one example, the inverse filter block 70 may include tight (e.g., high order) notch filters with similar frequencies as the synthesized frequencies in the noise information as provided from the noise parameters module 36 without removing too much of the environmental noise 20. The spectral weighting block 72 may also remove tonal information in addition to the noise information. The inverse filter block 70 may include one or more oscillators that are arranged at similar frequencies at each synthesized frequency component. Each oscillator may also include an inverted phase to cancel the synthesized frequency components.

The spectral weighting block 72 removes broadband components or the noise generated from the noise information (generated by the noise generator 52) in the previously generated synthesized engine sound 24 in the environmental noise 20. The spectral weighting block 72 receives the statically delayed values of the noise parameters. The spectral weighting block 72 may remove the previous noise information via subtraction of two filter banks, the use of an adaptive filter, or through the use of an echo canceller. It is recognized that in another example, the broadband components may also include any number of multiple tonal components.

In general, for the inverse filter block 70 and the spectral weighting block 72 to be less sensitive to changes in the environment, the speaker 16 and the microphone 18 should be positioned as close as possible to one another. While the delay compensation circuit 60 is configured to generate the static delay value to account for circuit processing (ADC, DAC, etc.), speaker group delay, and propagation time between the speaker 16 and the microphone 18; the delay compensation circuit 60 may not be configured to account for propagation delays from sound reflections of the loudspeaker 16 from other vehicles or buildings surrounding the vehicle 10. The inverse filter block 70 and the spectral weighting block 72 may be configured to compensate for these propagation delays.

The event filter block 73 is configured to remove noise attributed to short term impulses in the environmental noise 20. For example, it may not be necessary to further adjust the level for the synthesized engine sound for short term impulses such as the honk of a horn, etc. The event filter block 73 is configured to remove short term noise picked up at the microphone 18 so that the vehicle 10 does not further adjust the level of the synthesized engine sound. The event filter block 73 allows long term noise present in the environmental noise 20 to pass therethrough (e.g., noise attributed to sitting in a long traffic condition such as in an urban setting) so that the vehicle 10 generates the synthesized engine noise to account for the long term noise present in the environmental noise 20.

The psychoacoustic mask block 74 receives the environmental noise 20 that is uncorrupted from any bleed (or free from the previously generated synthesized engine sound 24) from the speaker 16. Generally, the inverse filter block 70 and the spectral weighting block 72 remove the previously generated synthesized engine sound 24 present in the microphone sense signal 26 to provide the environmental noise 20 to the psychoacoustic mask block 74. The psychoacoustic mask block 74 outputs a frequency-dependent threshold level that various dynamically based on the environmental noise 20. The gain estimator block 75 receives the newly generated engine sound from an output of the summer circuit 56. The gain estimator block 75 compares the newly generated engine sound to the threshold level based on the environmental noise 20. Any new engine sounds that are below the threshold level will not be audible. The gain estimator block 75 compares the threshold level to the newly generated sound level and outputs a gain value (or voltage). The gain estimator block 75 provides the gain voltage to the amplifier 58. The amplifier 58 controls the speaker 16 to generate the new generated engine sound that is perceptually louder than the environmental noise 20.

As exhibited above, the engine sound removal block 40 generally removes the previously generated synthesized engine sound 24 in the microphone sense signal 26 thereby removing the sound bleed condition as noted above. In addition, the engine sound removal block 40 provides a signal (or voltage) that corresponds to the environmental noise 20 such that the amplifier 58 generates a new generated synthesized engine sound that is perceptually louder than the environmental noise 20 to ensure that pedestrians 14 can hear the newly generated synthesized engine sound. Thus, if the environmental noise 20 increases, then the voltage from the engine sound removal block 40 will increase thereby enabling the synthesized engine sound to be perceptually louder than the environmental noise 20. Conversely, if the environmental noise 20 decreases, then the voltage from the engine sound removal block 40 will decrease but still enable the synthesized engine sound to be perceptually louder than the decreased actual environmental 20. The engine sound generator block 38 is free to generate the new synthesized engine sound without any leftover sound artifacts from the previously generated synthesized noise.

Figure 3:
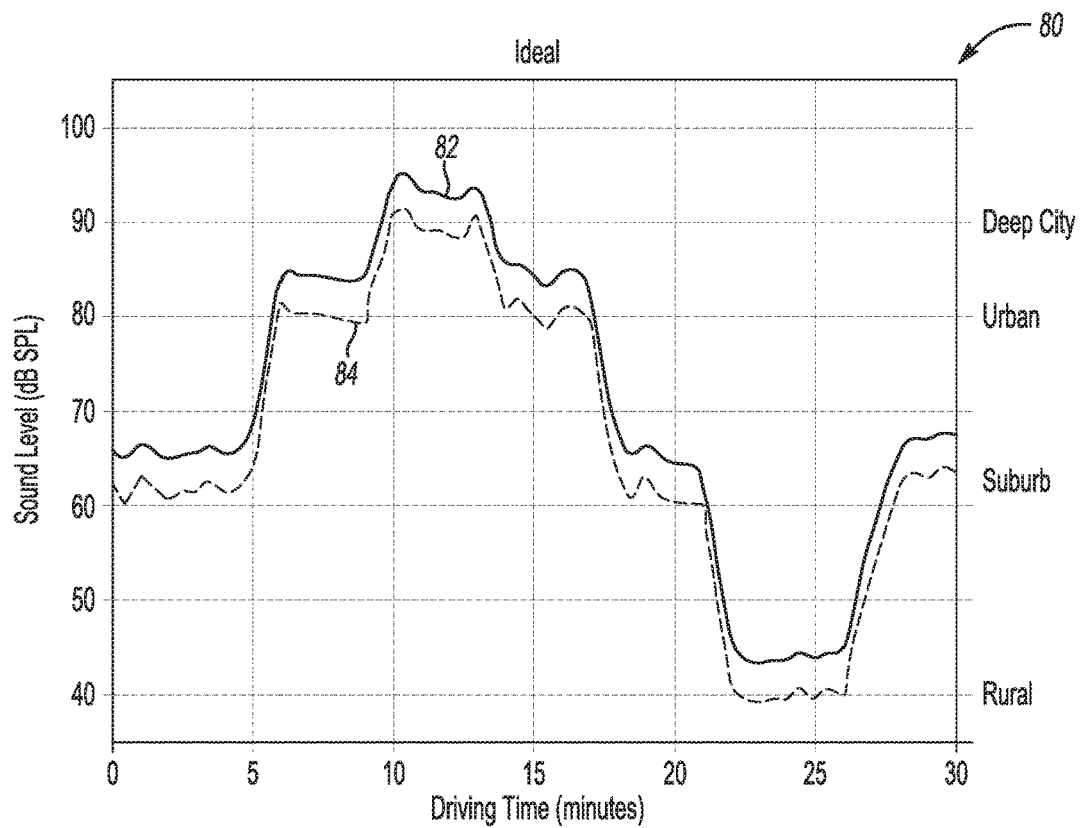
FIG. 3 is a plot illustrating an ideal condition with respect to the generation of a synthesized engine sound based on environmental noise.

FIG. 3 is a plot illustrating an ideal condition with respect to the generation of a synthesized engine sound based on environmental noise. Plot 80 includes a synthesized engine sound level 82 and an environmental noise level 84. It is desirable for the vehicle 10 to generate the synthesized engine sound level 82 at a level that is perceptually louder than the environmental noise level 84 to ensure that pedestrians 14 can hear the vehicle 10. As illustrated, plot 80 represents an ideal condition as the synthesized engine sound level 82 remains perceptually louder than the environmental noise level 84 as the vehicle travels between rural, suburban, urban, and deep city settings.

Figure 4:
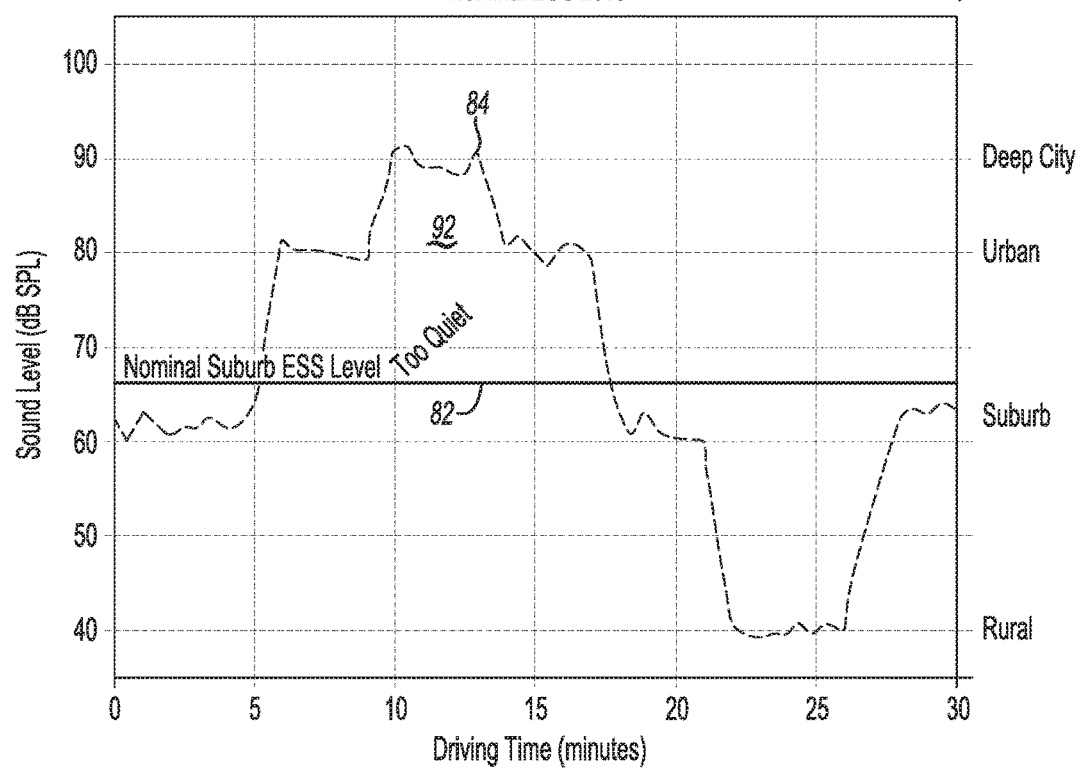
FIG. 4 is a plot illustrating the generation of a synthesized engine sound at a nominal level that is sometimes too quiet based on environmental noise.

FIG. 4 is a plot 90 illustrating the generation of a synthesized engine sound at a nominal level that is sometimes too quiet based on environmental noise. For example, plot 90 illustrates that the vehicle 10 generates the synthesized engine sound level 82 at a constant level (or volume) irrespective of the environmental noise level 84 as the environmental noise level 84 varies. In region 92, the synthesized engine sound level may be too quiet based on the environmental noise level 84. This condition may not alert the pedestrian(s) 14 of the presence of the vehicle 10.

Figure 5:
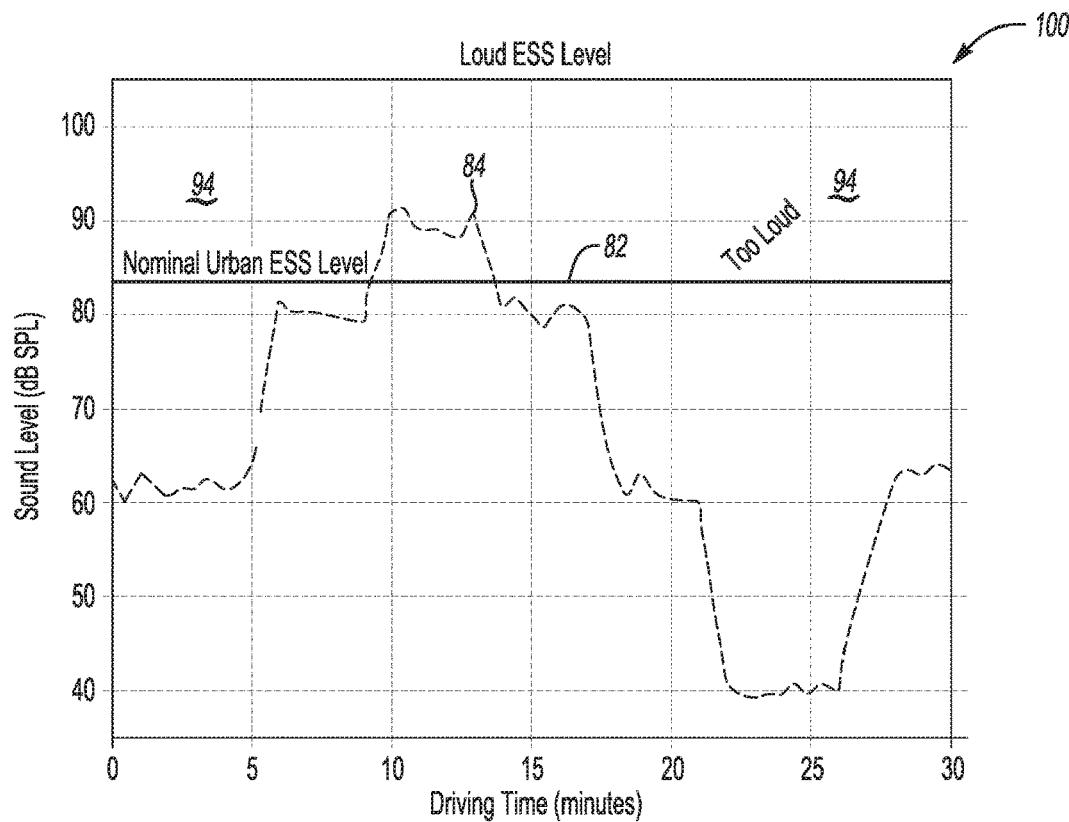
FIG. 5 is a plot illustrating the generation of the synthesized engine sound at a second level that is too loud based on environmental noise.

FIG. 5 is a plot 100 illustrating the generation of the synthesized engine sound at a level that is too loud based on environmental noise. For example, plot 100 illustrates that the vehicle 10 generates the synthesized engine sound level 82 at a constant level (or volume) irrespective of the environmental noise level 84 as the environmental noise level 84 varies. In region 94, the synthesized engine sound level 82 may be too loud based on the traffic level 84. This condition may be a nuisance to pedestrians 14.

Figure 6:
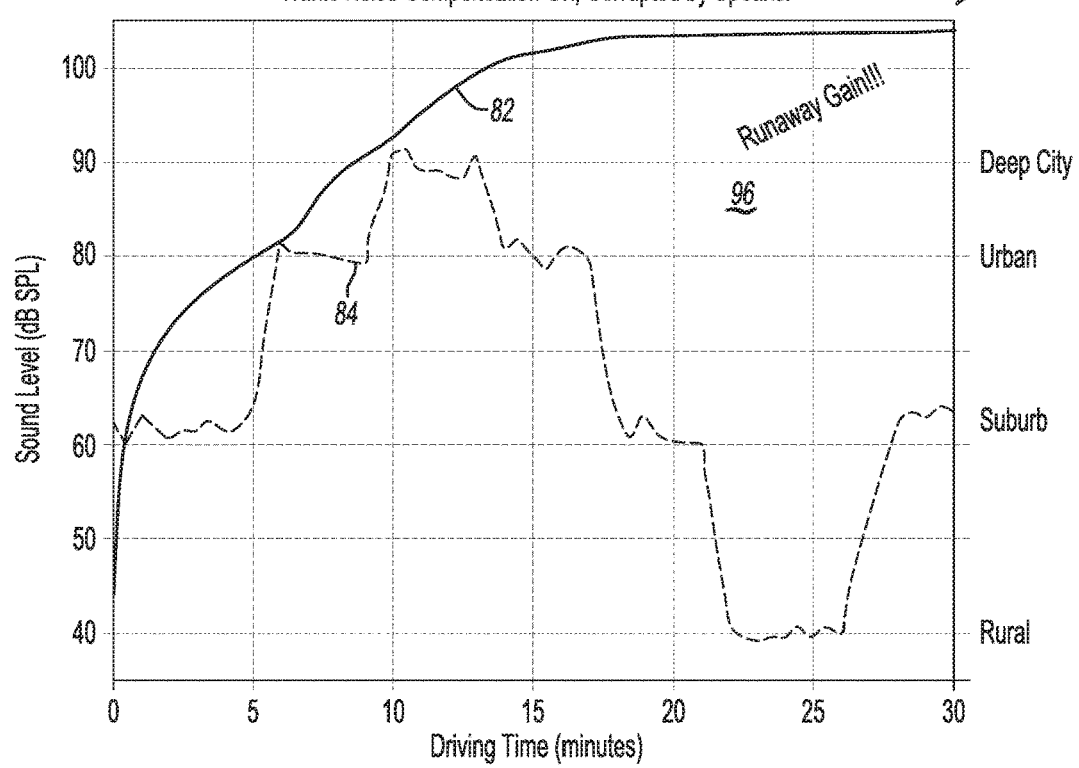
FIG. 6 is a plot illustrating a runway condition with respect to the generated synthesized engine sound.

FIG. 6 is a plot 110 illustrating a runway condition with respect to the synthesized engine sound level 82. Specifically, plot 110 depicts the condition in which vehicle 10 picks up the previously generated synthesized engine sound 24 (e.g., at the microphone 18) in addition to the environmental noise level 84 and fails to remove the engine sound from the microphone input signal 22. The vehicle 10 then generates the synthesized engine sound level 82 at a volume (or gain) that is perceptually louder than the previously generated engine sound level and the environmental noise level 84. As shown generally at 96, the gain of the synthesized engine sound level increases irrespective of the environmental level 84. Again, the synthesized engine sound level 82 may become too loud to the pedestrians 14.

Figure 7:
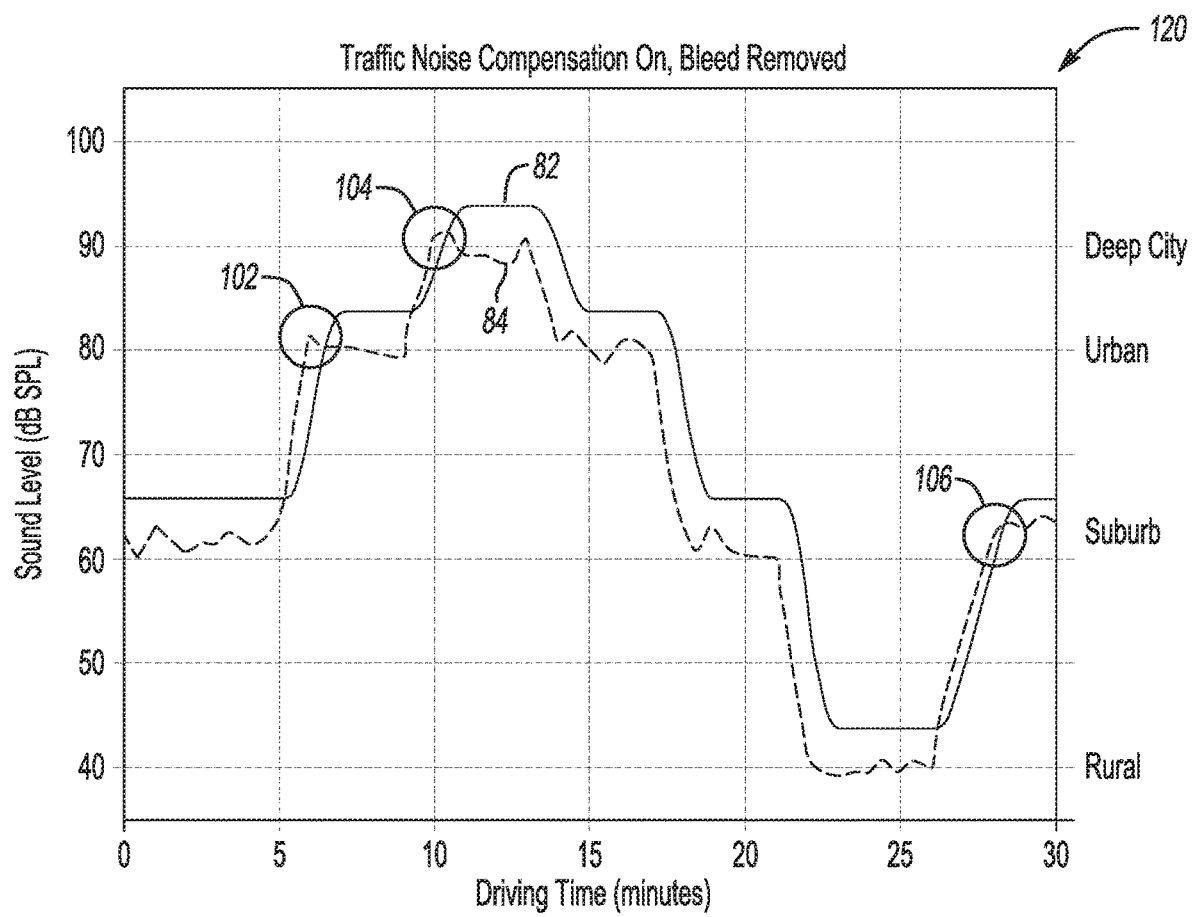
FIG. 7 is a plot illustrating removal of a sound bleed condition from the on environmental noise in accordance to one embodiment.

FIG. 7 is a plot 120 illustrating removal of the runway condition (or sound bleed condition) in accordance to one embodiment. Specifically, plot 100 illustrates the typical environmental noise level 84 while applying noise compensation to generate the synthesized engine sound. As generally shown, the vehicle 10 generates the synthesized engine sound level 82 at a gain that is perceptually louder than the environmental noise level 84 as the vehicle 10 travels. Plot 100 illustrates the condition in which the vehicle 10 filters the previously generated synthesized engine sound 24 from the environmental noise level 84 such that the vehicle 10 ascertains the true or actual environmental noise level 84. Once the previously generated synthesized engine sound 24 is removed from the environmental noise level 84, the vehicle 10 generates the synthesized engine sound level 82 at a gain that is perceptually louder than the traffic level 84 to provide notice to the pedestrian (14) of the presence of the vehicle 10.

Generally, points 102, 104, and 106 indicate that the environmental noise level 84 may be momentarily greater than the synthesized engine sound level 82. These points 102, 104, and 106 merely reflect the apparatus 30 performing an averaging operation to compensate for long term sounds due to the rapid increase of the traffic level 86. The event filter block 73 is configured to perform this averaging. Such a rapid increase in the environmental noise level 84 may be attributed a neighboring vehicle(s) honking a horn or a pedestrian 14 (or group of pedestrians 14) yelling.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An apparatus for generating a simulated vehicle sound, the apparatus comprising:
at least one parameter module configured to receive a first driver throttle signal indicative of a first position of a throttle for a vehicle and to transmit a first input signal indicative of a first simulated vehicle sound in response to at least the first driver throttle signal;
an engine sound generator block configured to audibly generate a first simulated vehicle sound in response to the first input signal; and
an engine sound removal block for being operably coupled to a microphone that receives a first microphone input signal, the first microphone input signal including a first environmental noise associated with an environment exterior to the vehicle and the first simulated vehicle sound, the engine sound removal block being configured to:
filter the first simulated vehicle sound from the first microphone input signal to determine the first environmental noise;
generate a first output signal indicative of the first environmental noise;
wherein the engine sound generator block is further configured to generate a second simulated vehicle sound in response to at least the first output signal such that the second simulated vehicle sound is louder than the first environmental noise; and
wherein the engine sound removal block includes an inverse filter block and a spectral weighting block configured to compensate for propagation delays attributed to reflections of the first simulated vehicle sound from a surrounding vehicle or building.

2. The apparatus of claim 1, wherein the inverse filter block and the spectral weighting block is further configured to compensate for the propagation delays attributed to the reflections of the first simulated vehicle sound from the surrounding vehicle or the building prior to generating the second simulated vehicle sound.

3. The apparatus of claim 1, wherein the inverse filter block includes a notch filter with a frequency component that matches a synthesized frequency component of the first simulated vehicle sound to cancel the synthesized frequency component.

4. The apparatus of claim 1, wherein the engine sound removal block further includes an event filter configured to remove short-term noise on the first environmental noise that is present on the first environmental noise for a time period that is less than a predetermined amount of time.

5. The apparatus of claim 4, wherein the engine sound removal block is further configured to refrain from adjusting a level of the second simulated vehicle sound after the event filter removes the short-term noise on the first environmental noise.

6. The apparatus of claim 4, wherein the event filter is further configured to enable long term noise on the first environmental noise for a time period that is greater than the predetermined amount of time to pass therethrough without performing any filtering thereof.

7. The apparatus of claim 6, wherein the engine sound removal block is further configured to adjust a level of the second simulated vehicle sound in response to the long term noise on the first environment noise.

8. The apparatus of claim 1, wherein the engine sound removal block includes a psychoacoustic mask block that is configured to output a frequency-dependent threshold level that varies based on the first environmental noise.

9. The apparatus of claim 8, wherein the engine sound removal block includes a gain estimator block that is configured to compare a newly generated simulated vehicle sound to the frequency-dependent threshold level.

10. The apparatus of claim 9, wherein the gain estimator block is further configured to output a gain value corresponding to the second simulated vehicle sound if the newly generated simulated vehicle sound is greater than the frequency-dependent threshold level.

11. An apparatus for generating a simulated vehicle sound, the apparatus comprising:
at least one parameter module configured to receive a first vehicle speed signal indicative of a first speed of a vehicle and to transmit a first input signal indicative of a first simulated vehicle sound in response to at least the first vehicle speed signal;
an engine sound generator block configured to audibly generate a first simulated vehicle sound in response to the first input signal; and
an engine sound removal block for being operably coupled to a microphone that receives a first microphone input signal, the first microphone input signal including a first environmental noise associated with an environment exterior to the vehicle and the first simulated vehicle sound, the engine sound removal block being configured to:
filter the first simulated vehicle sound from the first microphone input signal to determine the first environmental noise; and
generate a first output signal indicative of the first environmental noise,
wherein the engine sound generator block is further configured to generate a second simulated vehicle sound in response to at least the first output signal such that the second simulated vehicle sound is louder than the first environmental noise, and
wherein the engine sound removal block includes an inverse filter block and a spectral weighting block configured to compensate for propagation delays attributed to reflections of the first simulated vehicle sound from a surrounding vehicle or building.

12. The apparatus of claim 11, wherein the inverse filter block and the spectral weighting block is further configured to compensate for the propagation delays attributed to the reflections of the first simulated vehicle sound from the surrounding vehicle or the building prior to generating the second simulated vehicle sound.

13. The apparatus of claim 11, wherein the inverse filter block includes a notch filter with a frequency component that matches a synthesized frequency component of the first simulated vehicle sound to cancel the synthesized frequency component.

14. The apparatus of claim 11, wherein the engine sound removal block further includes an event filter configured to remove short-term noise on the first environmental noise that is present on the first environmental noise for a time period that is less than a predetermined amount of time.

15. The apparatus of claim 14, wherein the engine sound removal block is further configured to refrain from adjusting a level of the second simulated vehicle sound after the event filter removes the short-term noise on the first environmental noise.

16. The apparatus of claim 14, wherein the event filter is further configured to enable long term noise on the first environmental noise for a time period that is greater than the predetermined amount of time to pass therethrough without performing any filtering thereof.

17. The apparatus of claim 16, wherein the engine sound removal block is further configured to adjust a level of the second simulated vehicle sound in response to the long term noise on the first environment noise.

18. The apparatus of claim 11, wherein the engine sound removal block includes a psychoacoustic mask block that is configured to output a frequency-dependent threshold level that varies based on the first environmental noise.

19. The apparatus of claim 18, wherein the engine sound removal block includes a gain estimator block that is configured to compare a newly generated simulated vehicle sound to the frequency-dependent threshold level.

20. An apparatus for generating a simulated vehicle sound, the apparatus comprising:
a first parameters module configured to generate tonal information related to a first vehicle operating characteristic;
a second parameters module configured to generate noise information related to the first vehicle operating characteristic;
an engine sound generator block configured to audibly generate a first simulated vehicle sound in response to the tonal information and the noise information; and
an engine sound removal block for being operably coupled to a microphone that receives a first microphone input signal, the first microphone input signal including a first environmental noise associated with an environment exterior to a vehicle and the first simulated vehicle sound, the engine sound removal block being configured to:
remove the first simulated vehicle sound from the first microphone input signal to determine the first environmental noise; and
generate an output signal indicative of the environmental noise,
wherein the engine sound generator block is further configured to generate a second simulated vehicle sound in response to at least the output signal such that the second simulated vehicle sound is louder than the first environmental noise, and
wherein the engine sound removal block is configured to compensate for propagation delays attributed to reflections of the first simulated vehicle sound from a surrounding vehicle or building.

* * * * *